United States Patent
Seto

(10) Patent No.: US 7,642,595 B2
(45) Date of Patent: Jan. 5, 2010

(54) NONVOLATILE SEMICONDUCTOR MEMORY AND METHOD OF FABRICATION THEREOF

(75) Inventor: Masaru Seto, Miyagi (JP)

(73) Assignee: OKI Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 11/878,850

(22) Filed: Jul. 27, 2007

(65) Prior Publication Data
US 2008/0048238 A1 Feb. 28, 2008

(30) Foreign Application Priority Data
Aug. 28, 2006 (JP) ............................. 2006-230018

(51) Int. Cl.
*H01L 29/76* (2006.01)
(52) U.S. Cl. .................................. 257/319; 257/E21.68
(58) Field of Classification Search ................ 257/314, 257/315, 319, E21.666, E21.68; 438/157, 438/195, 257
See application file for complete search history.

(56) References Cited

U.S. PATENT DOCUMENTS 7,018,894 B2 * 3/2006 Shin et al. ................... 438/257

FOREIGN PATENT DOCUMENTS

JP 7249746 9/1995

* cited by examiner

*Primary Examiner*—David Vu
(74) *Attorney, Agent, or Firm*—Rabin & Berdo, P.C.

(57) ABSTRACT

There are provided a nonvolatile semiconductor memory of a structure in which electric signals from peripheral circuits are reliably transferred to control gates via word lines even if contact holes cannot be opened accurately above the word lines, and a method of fabricating the nonvolatile semiconductor memory. Plural word lines and plural bit lines are disposed on a semiconductor substrate, and there are memory cells at intersecting portions of the word lines and the bit lines. At contact portions of the word lines and metal wires of an upper layer, polysilicon regions, which include the contact portions, are formed beneath a polysilicon forming the word lines, as an etching stop layer at a time of forming contacts.

6 Claims, 14 Drawing Sheets

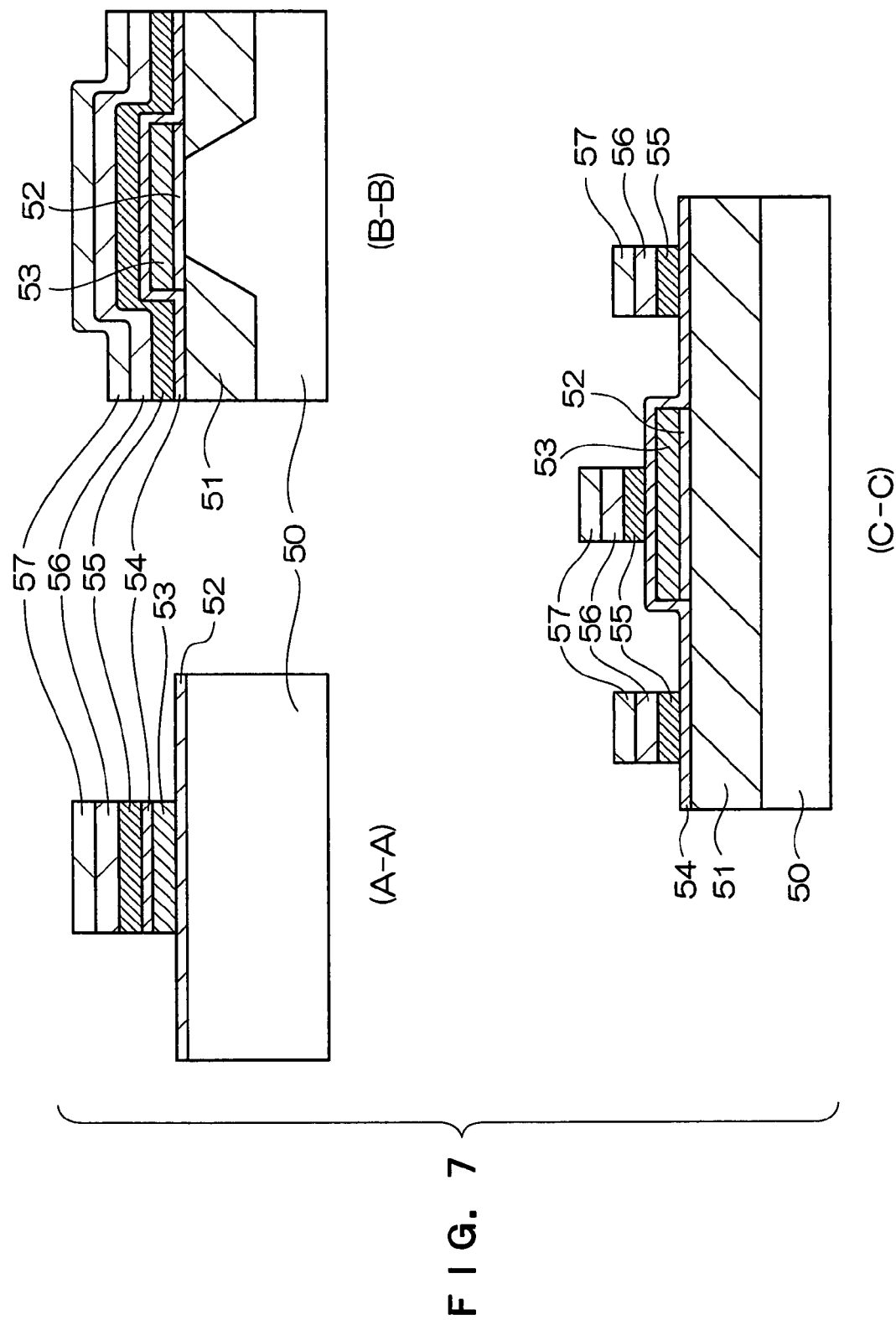
F I G. 7

NONVOLATILE SEMICONDUCTOR MEMORY AND METHOD OF FABRICATION THEREOF

CROSS-REFERENCE TO RELATED APPLICATION

This application claims priority under 35 USC 119 from Japanese Patent Application No. 2006-230018, the disclosure of which is incorporated by reference herein.

BACKGROUND OF THE INVENTION

1. Field of the Invention

The present invention relates to a nonvolatile semiconductor memory having a stacked gate structure including a floating gate, and to a method of fabrication thereof, and in particular, the present invention relates to an improved technique for reducing poor fabrication of such a nonvolatile semiconductor memory.

2. Description of the Related Art

A conventional nonvolatile semiconductor memory such as an EEPROM or the like (see, for example, Japanese Patent Application Laid-Open (JP-A) No. 7-249746) has a memory array in which the word lines and bit lines intersect in a plane, and transistors having stacked gate structures, which are formed from a floating gate and a control gate, are formed at these intersecting portions.

In such a nonvolatile semiconductor memory, the control gate is formed of an electrically-conductive film of polysilicon or the like. In order to make this polysilicon be conductive with the circuits at the periphery of the memory array (the peripheral circuits) and form the word lines, usually, contacts must be opened, and the polysilicon and the metal wires (e.g., aluminum wires) at the peripheral circuits must be connected via these contacts.

However, in recent years, accompanying the advance of microfabrication technology in semiconductor memories, the intervals between adjacent word lines (the polysilicon) have become more narrow. For this reason, at the time of opening the aforementioned contacts, it has become difficult to open the contacts with precision above the polysilicon where the control gates are formed. If the contacts cannot be opened with precision above the polysilicon, there is the concern that problems will arise, such as the metal wires at the peripheral circuits will be conductive with the substrate of the nonvolatile semiconductor memory, or the like. Namely, in the process of opening the contacts, over-etching is carried out in order to avoid poor opening. However, there is the concern that, due to this over-etching, the field oxide film will be etched and the contacts will reach to the substrate. If the contacts reach to the substrate, the problem arises that the electric signals from the peripheral circuits cannot be transferred to the control gates via the word lines.

On the other hand, due to the capabilities of the fabricating devices and the like, there are limits on precisely opening contacts above the polysilicon regardless of the intervals between the adjacent word lines (the polysilicon).

From the above, there have been desired a nonvolatile semiconductor memory of a structure in which electric signals from peripheral circuits are reliably transferred to control gates via word lines even if contact holes cannot be precisely opened above the word lines, and a method of fabricating such a nonvolatile semiconductor memory.

SUMMARY OF THE INVENTION

The invention provides a nonvolatile semiconductor memory in which a plurality of word lines and a plurality of bit lines are disposed on a semiconductor substrate, and which has memory cells at intersecting portions of the word lines and the bit lines, the nonvolatile semiconductor memory having: a first insulating film formed on the semiconductor substrate; an etching stop layer of a first shape which is formed on the first insulating film and which, in plan view, includes at least contact portions of the word lines and metal wires of an upper layer; a second insulating film formed on the etching stop layer; and a conductive film and formed on the second insulating film as the word lines.

In accordance with the nonvolatile semiconductor memory of the invention, in an etching process at the time of opening contact holes at contact portions of word lines (the conductive film) and metal wires of an upper layer, even in cases in which the contact holes cannot be precisely opened above the conductive film, the etching stop layer which is beneath the conductive film is formed in shapes (the first shapes) which include the contact portions, and therefore, the etching is stopped at this etching stop layer. Accordingly, the semiconductor substrate is not damaged, and poor junctions do not arise.

A method of fabricating a nonvolatile semiconductor memory of the invention is a method of fabricating a nonvolatile semiconductor memory in which a plurality of word lines and a plurality of bit lines are disposed on a semiconductor substrate, and which has memory cells at intersecting portions of the word lines and the bit lines, the method including: forming a first insulating film on the semiconductor substrate; forming a first polysilicon film on the first insulating film; patterning the first polysilicon film, and forming floating gates of the memory cells, and forming first shapes which include contact portions of the word lines and metal wires of an upper layer; forming a second insulating film on the first polysilicon film; forming a conductive film on the second insulating film; patterning the conductive film, and forming control gates of the memory cells, and forming strip-shaped regions as the word lines; accumulating an interlayer insulating film on the conductive film; and etching the interlayer insulating film, and opening, above the conductive film, contact holes for the contact portions.

In accordance with the method of fabricating a nonvolatile semiconductor memory of the invention, before carrying out a process (contact hole etching process) in which the interlayer insulating film is etched and contact holes for contact portions are formed above the conductive film, the first polysilicon film is already formed in shapes (the first shapes) which include the contact portions. Then, in the contact hole etching step, even in cases in which the contact holes cannot be opened with precision above the conductive film, the first polysilicon film of the first shape, which is formed beneath the conductive film, functions as an etching stop layer. Accordingly, in a nonvolatile semiconductor memory which is fabricated in accordance with this fabricating method, the semiconductor substrate is not damaged by the contact hole etching processing, and poor junctions do not arise.

Further, in this fabricating method, the floating gates of the memory cells, and the first shapes which include the contact portions of the word lines and the metal wires of the upper layer, are formed simultaneously by patterning the first polysilicon film. Accordingly, an additional process for forming the first polysilicon film as the etching stop layer is not needed.

In accordance with the present invention, even if contact holes cannot be opened accurately above word lines, electric signals from peripheral circuits can be reliably transferred to control gates via the word lines.

BRIEF DESCRIPTION OF THE DRAWINGS

Preferred exemplary embodiments of the present invention will be described in detail based on the following figures wherein:

FIG. 7A is a cross-sectional view showing the method of fabricating the EEPROM relating to the exemplary embodiment, and is a cross-sectional view along segment A-A of FIG. 1;

FIG. 7B is a cross-sectional view showing the method of fabricating the EEPROM relating to the exemplary embodiment, and is a cross-sectional view along segment B-B of FIG. 1;

FIG. 7C is a cross-sectional view showing the method of fabricating the EEPROM relating to the exemplary embodiment, and is a cross-sectional view along segment C-C of FIG. 1;

DETAILED DESCRIPTION OF THE INVENTION

FIRST EXEMPLARY EMBODIMENT

An EEPROM, which is an exemplary embodiment of a nonvolatile semiconductor memory of the present invention, will be described hereinafter.

Figure 1:
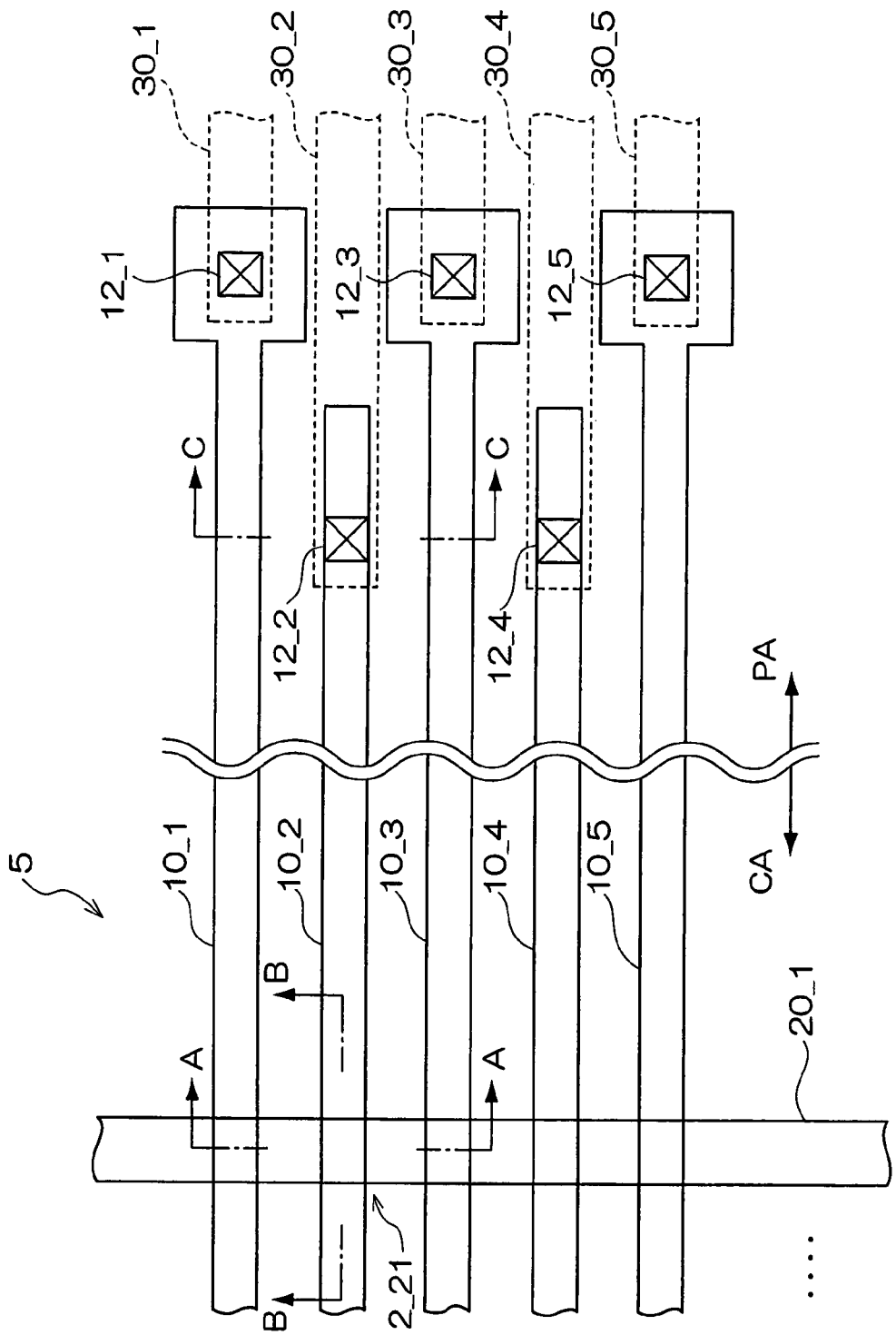
FIG. 1 is a plan view showing a portion of a memory cell array of an EEPROM relating to an exemplary embodiment.
Figure 2:
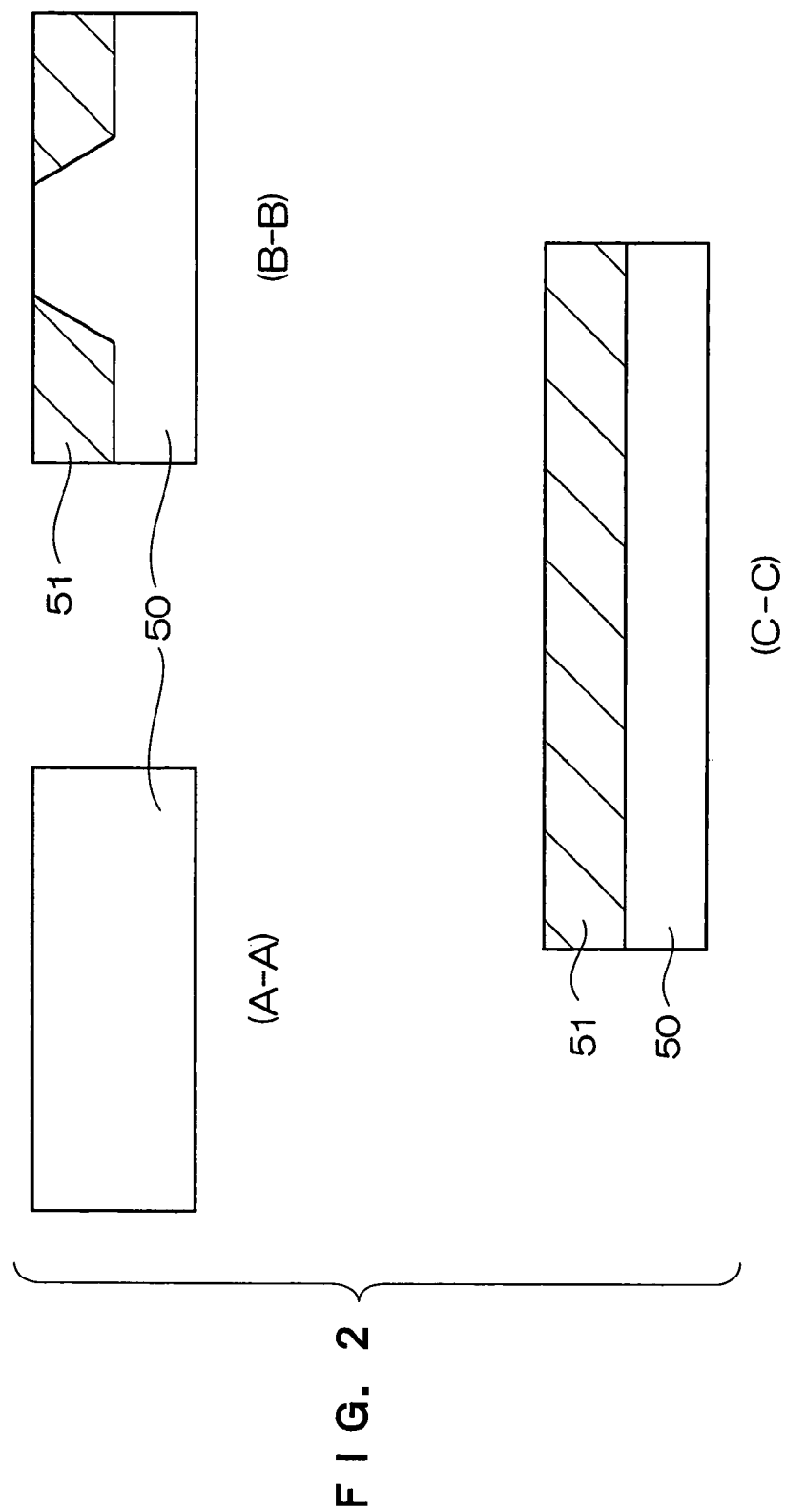
FIG. 2A is a cross-sectional view showing a method of fabricating an EEPROM relating to the exemplary embodiment.
FIG. 2B is a cross-sectional view showing the method of fabricating the EEPROM relating to the exemplary embodiment.
FIG. 2C is a cross-sectional view showing the method of fabricating the EEPROM relating to the exemplary embodiment.

FIG. 1 is a plan view showing a portion of a memory cell array of an EEPROM relating to a first exemplary embodiment of the present invention. FIGS. 2 through 9 are cross-sectional views showing the fabricating method relating to the present invention, in the order of the processes thereof. Note that, in FIGS. 2 through 7, (A-A), (B-B), and (C-C) respectively show cross-sectional views along line A-A, line B-B, and line C-C in FIG. 1. Namely, (A-A) and (B-B) are respectively cross-sectional views in the bit line direction and the word line direction at a memory cell. Further, (C-C) is a cross-sectional view of plural word lines (word lines 10_1 through 10_3 which will be described later), and, in particular, shows the cross-section at the position of a contact portion of one of these word lines (word line 10_2 which will be described later) and a metal wire of an upper portion.

Figure 8A:
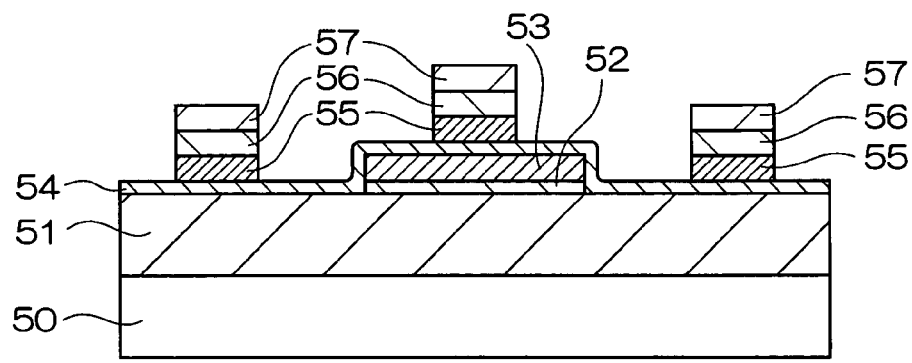
FIG. 8A is a cross-sectional view showing the method of fabricating the EEPROM relating to the exemplary embodiment.
Figure 8B:
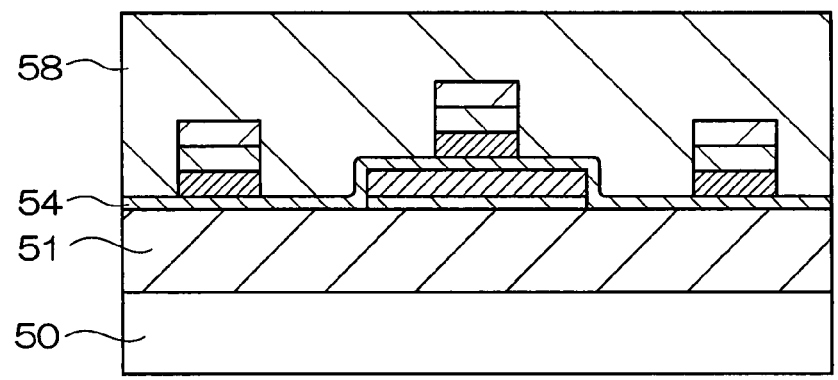
FIG. 8B is a cross-sectional view showing the method of fabricating the EEPROM relating to the exemplary embodiment.
Figure 8C:
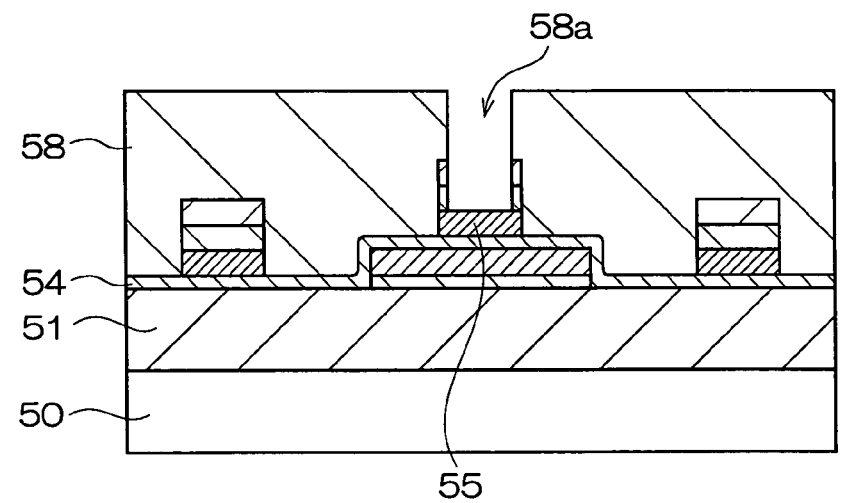
FIG. 8C is a cross-sectional view showing the method of fabricating the EEPROM relating to the exemplary embodiment.
Figure 9:
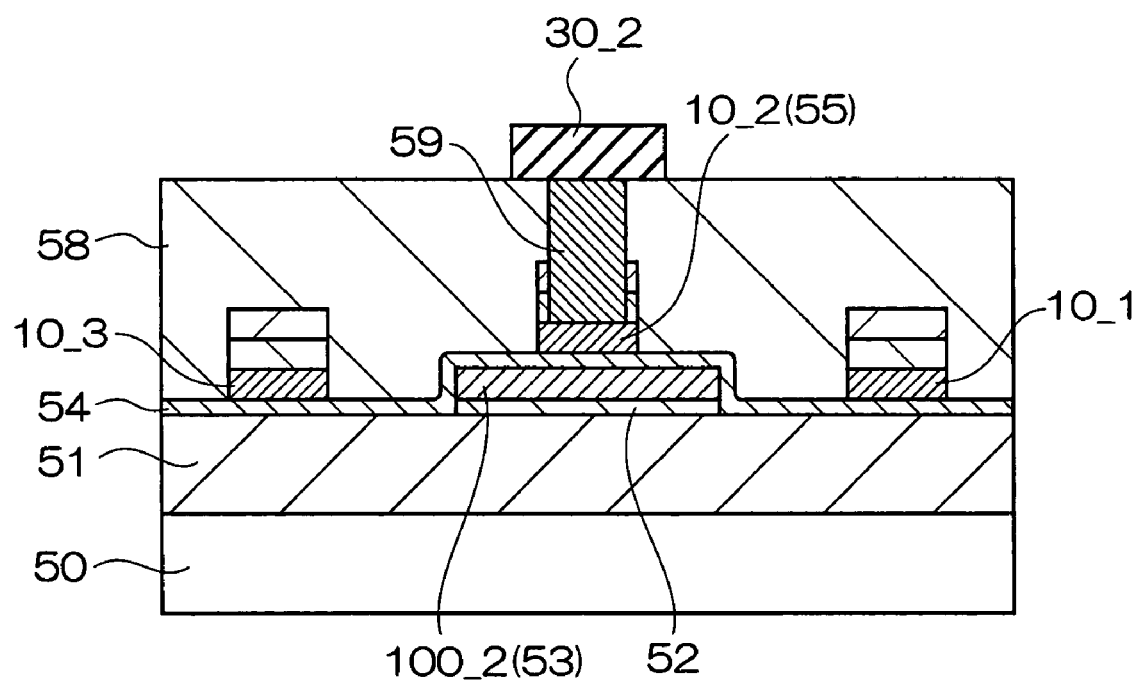
FIG. 9 is a cross-sectional view showing the method of fabricating the EEPROM relating to the exemplary embodiment.

FIGS. 8A through 9 are cross-sectional views along line C-C in FIG. 1.

(Overall Structure of EEPROM)

Referring to FIG. 1, plural word lines 10_1, 10_2, 10_3, 10_4, 10_5, . . . , and plural bit lines 20_1, . . . , are disposed at the EEPROM. The EEPROM has a memory array 5 which is formed from memory cells which are provided at the intersecting portions of these word lines and bit lines. For example, memory cell 2_21 is formed at the intersecting portion of the word line 10_2 and the bit line 20_1. The respective word lines 10_1 through 10_5 are formed of polysilicon, and are connected to metal wires 30_1 through 30_5 via contacts 12_1 through 12_5, respectively.

Note that, in the figures, the region where the memory array 5 is formed is denoted as cell area (CA), and the region where the contacts 12_1 through 12_5 are formed is denoted as peripheral area (PA).

(Method of Fabricating EEPROM)

Next, a method of fabricating the EEPROM relating to the present exemplary embodiment will be described in order with reference to FIG. 2 through FIG. 8C.

First, a silicon oxide film of a film thickness of about 100 Å for example is formed by thermally oxidizing the surface of a semiconductor substrate 50. Then, a silicon nitride film of a film thickness of about 1000 Å for example is formed on the silicon oxide film by using a known LPCVD (low pressure CVD) method. Then, the silicon oxide film and the silicon nitride film are patterned by photolithography and etching. By thermally oxidizing the surface of the semiconductor substrate 50 which is exposed by this etching, an element isolating film 51 is selectively formed on the semiconductor substrate 50 as shown in (B-B) of FIG. 2. An element forming region is demarcated by this element isolating film 51.

Note that the silicon oxide film and the silicon nitride film are removed after the element isolating film 51 is formed.

Figure 3:
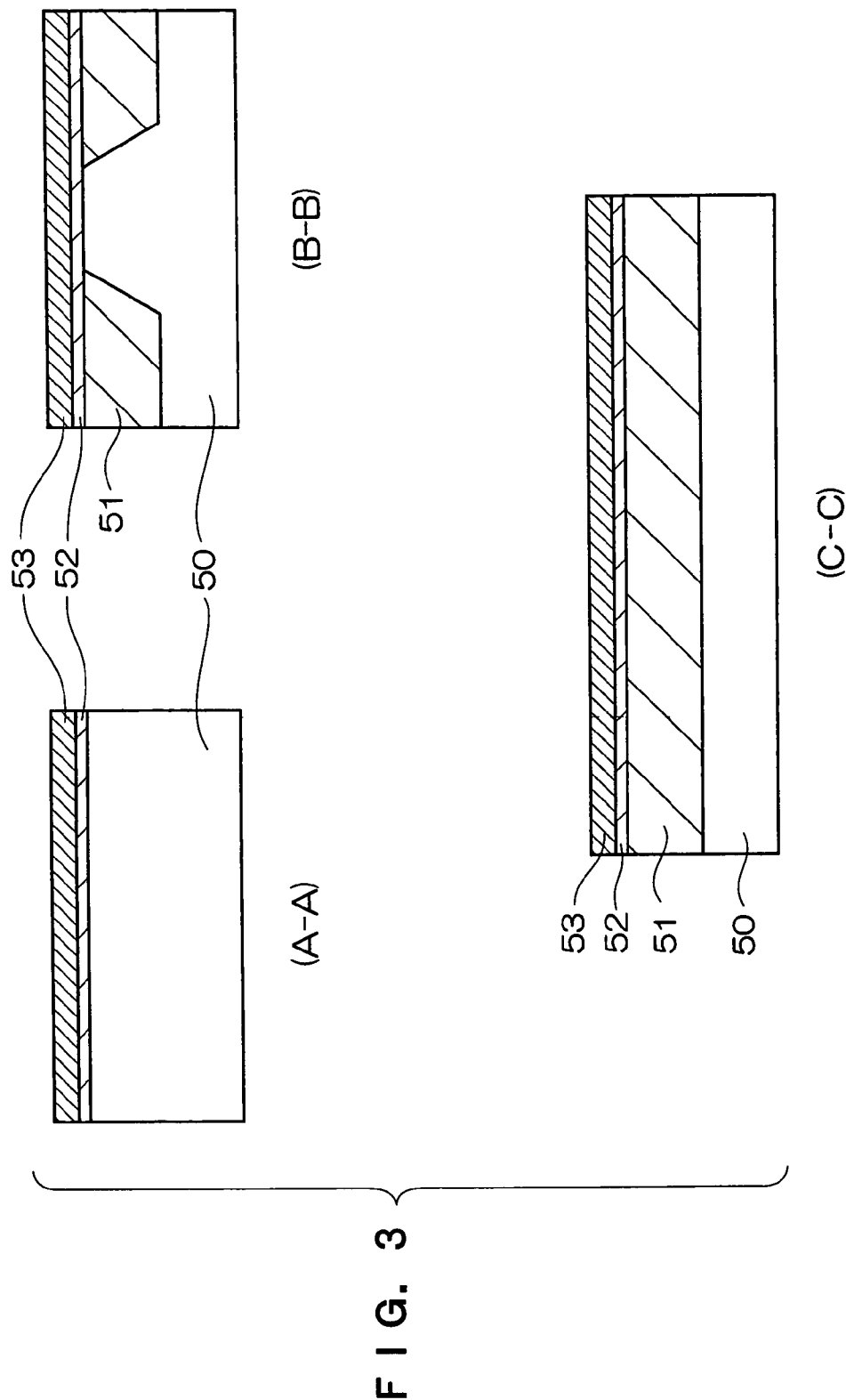
FIG. 3A is a cross-sectional view showing the method of fabricating the EEPROM relating to the exemplary embodiment.
FIG. 3B is a cross-sectional view showing the method of fabricating the EEPROM relating to the exemplary embodiment.
FIG. 3C is a cross-sectional view showing the method of fabricating the EEPROM relating to the exemplary embodiment.

Next, a silicon oxide film 52 (first insulating film) of a film thickness of about 100 Å is formed on the surface of the element forming region under a dry oxidation condition of 900° C. for example. Then, a polysilicon 53 (first polysilicon film) of a film thickness of about 500 Å for example is accumulated on the silicon oxide film 52 by LPCVD. In this way, a structure such as shown in FIG. 3 is formed.

Note that, thereafter, phosphorus (P) or arsenic (As) are introduced into the polysilicon 53 in a concentration of 2E20 [1/cm$^3$] by ion injection or vapor phase diffusion.

Next, by photolithography, a region corresponding to the gate width of a floating gate is covered and the polysilicon 53 and the silicon oxide film 52 are anisotropically etched in that order. A tunnel oxide film (the silicon oxide film 52) and a floating gate (the polysilicon 53) are thereby patterned as shown in (B-B) of FIG. 4.

Figure 4:
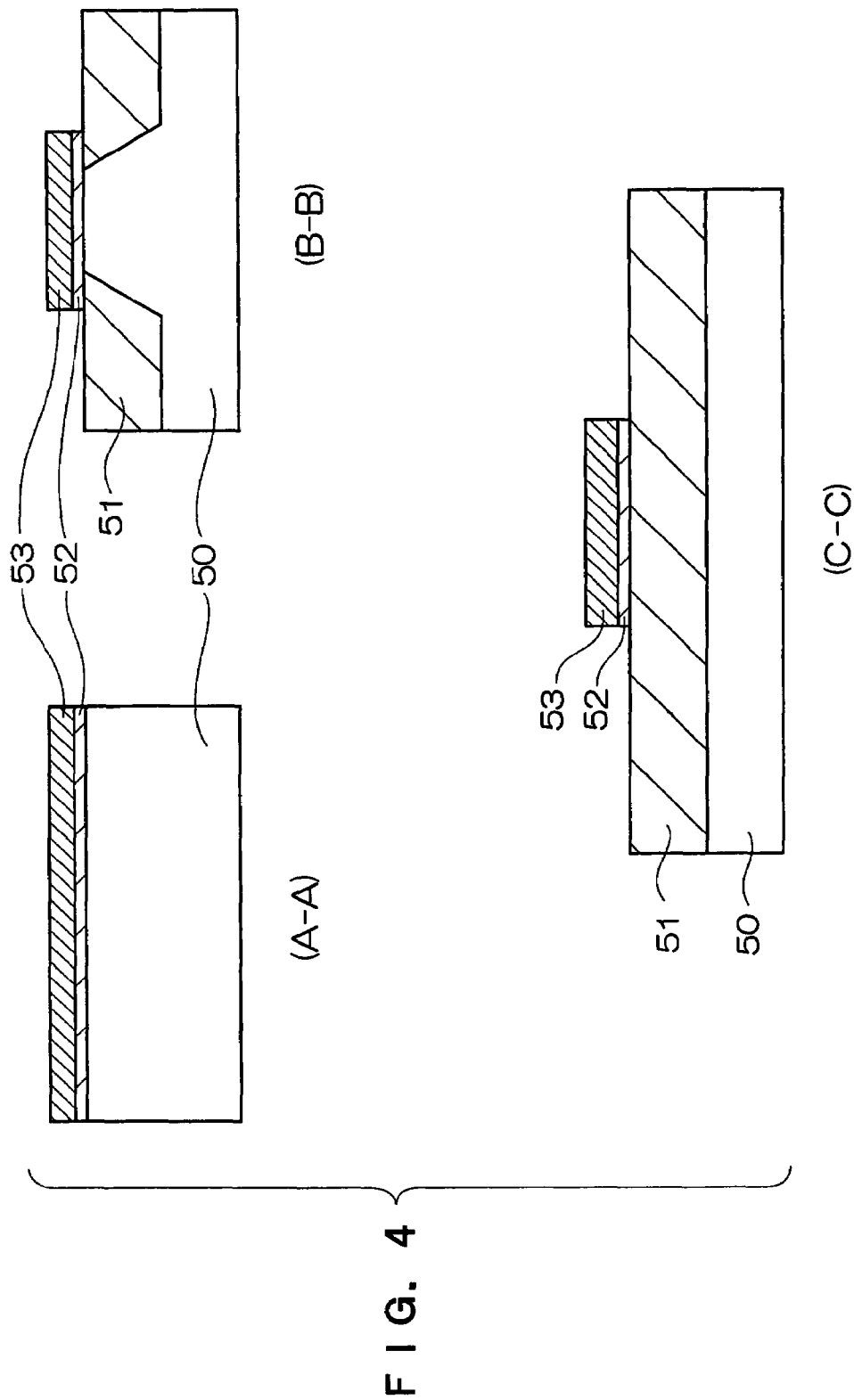
FIG. 4A is a cross-sectional view showing the method of fabricating the EEPROM relating to the exemplary embodiment.
FIG. 4B is a cross-sectional view showing the method of fabricating the EEPROM relating to the exemplary embodiment.
FIG. 4C is a cross-sectional view showing the method of fabricating the EEPROM relating to the exemplary embodiment.

Note that, in this process, as shown in (C-C) of FIG. 4, the polysilicon 53 is simultaneously patterned at the position of the word line 10_2 where the contact portion with a metal wire of the upper portion is formed, i.e., at a substantially central position of the word line 10_2. The patterned shape (first shape) of the polysilicon 53 at this contact portion of the word line is, as will be described later, a shape which includes at least the contact portion of the word line and the metal wire of the upper layer.

Figure 5:
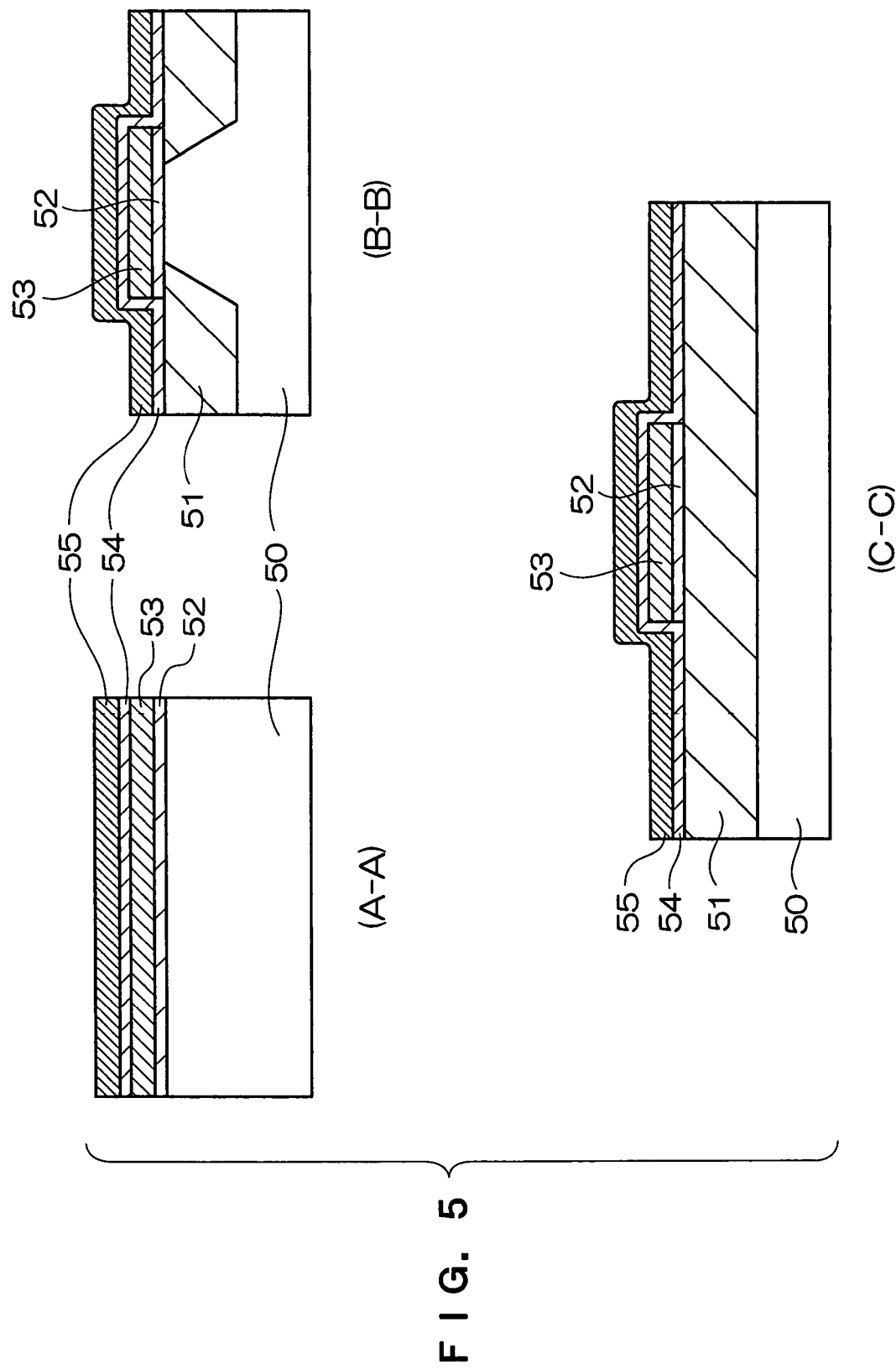
FIG. 5A is a cross-sectional view showing the method of fabricating the EEPROM relating to the exemplary embodiment.
FIG. 5B is a cross-sectional view showing the method of fabricating the EEPROM relating to the exemplary embodiment, and is a cross-sectional view along segment B-B of FIG. 1.
FIG. 5C is a cross-sectional view showing the method of fabricating the EEPROM relating to the exemplary embodiment, and is a cross-sectional view along segment C-C of FIG. 1.

Next, a silicon oxide film 54 (second insulating film) of a film thickness of 100 Å is formed on the polysilicon 53 under a dry oxidation condition of 950° C. for example. Then, a polysilicon 55 (conductive film) of a film thickness of 1000 Å for example is accumulated by LPCVD on the silicon oxide film 54. In this way, a structure such as shown in FIG. 5 is formed.

Note that, thereafter, phosphorus (P) or arsenic (As) are introduced into the polysilicon 55 in a concentration of 4E20 [1/cm$^3$] by ion injection or vapor phase diffusion.

Figure 6:
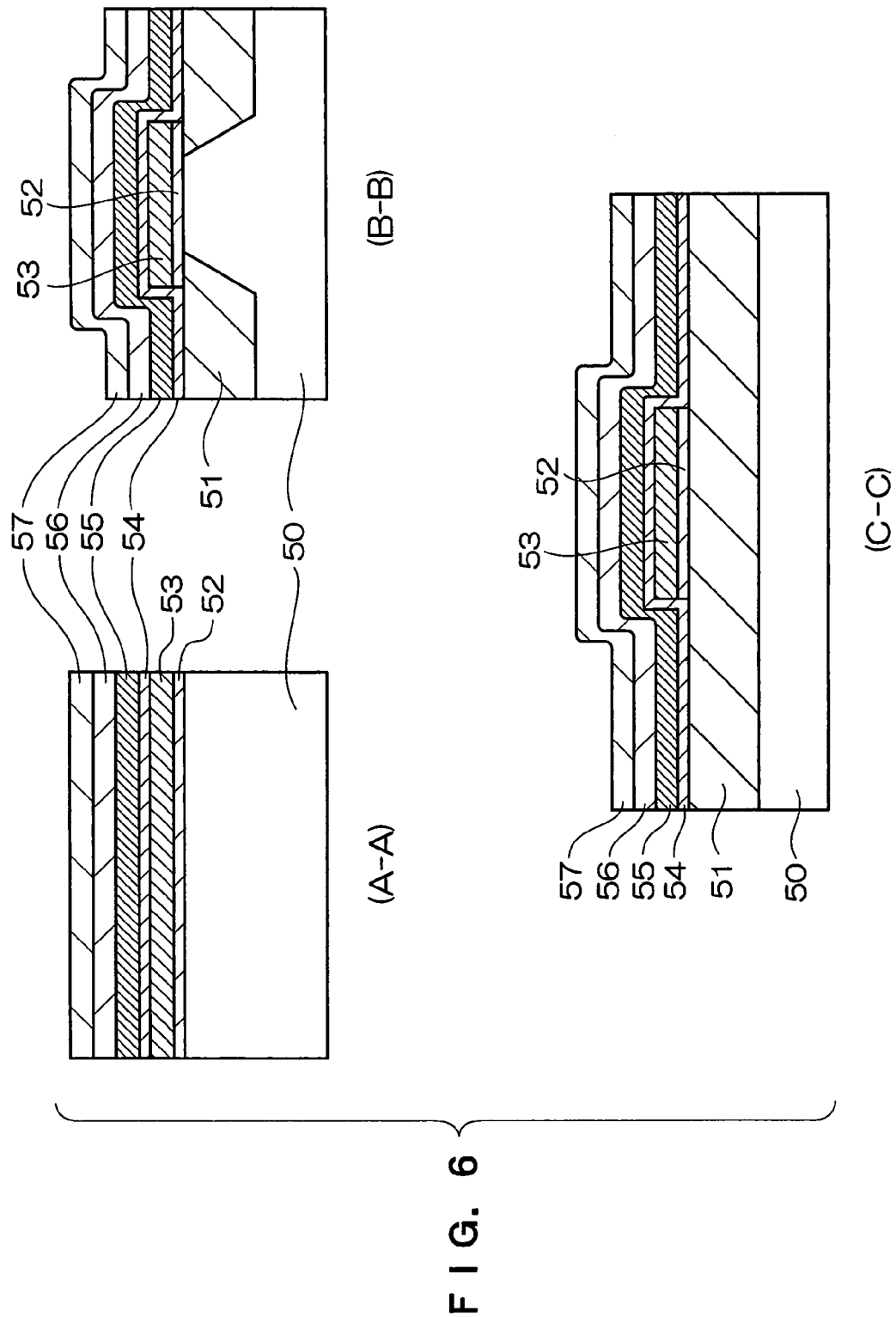
FIG. 6A is a cross-sectional view showing the method of fabricating the EEPROM relating to the exemplary embodiment, and is a cross-sectional view along segment A-A of FIG. 1.
FIG. 6B is a cross-sectional view showing the method of fabricating the EEPROM relating to the exemplary embodiment, and is a cross-sectional view along segment B-B of FIG. 1.
FIG. 6C is a cross-sectional view showing the method of fabricating the EEPROM relating to the exemplary embodiment, and is a cross-sectional view along segment C-C of FIG. 1.

Next, for example, a tungsten silicide (WSix) film 56 is accumulated by CVD as a silicide film having a film thickness of about 1000 Å. Further, an NSG (Nondoped Silicate Glass) film 57 having a film thickness of about 1000 Å is accumulated by CVD. In this way, a structure such as shown in FIG. 6 is formed.

Subsequently, a predetermined region needed for the control gate is covered by photolithography, and thereafter, by carrying out anisotropic etching, the gate of the memory cell is patterned as shown in (A-A) of FIG. 7. At this time, as shown in (C-C) of FIG. 7, the word lines (the polysilicon 55) are also patterned simultaneously.

Then, a mask oxide film having a film thickness of about 100 Å is patterned and placed on the gate. Thereafter, phosphorus (P) or arsenic (As) is ion-injected at a dosage of about 1E15 [1/cm$^2$], and diffusion layers which become the source/drain regions are formed at both sides of the gate.

Next, the processes of forming the contacts of the word lines and the metal wires will be described with reference to FIGS. 8A through 8C and FIG. 9. FIGS. 8A through 8C and FIG. 9 show the formation processes in order, with the state of the element shown in (C-C) of FIG. 7 being the starting point. Note that, although not shown, in these processes, contact holes are simultaneously opened and metal wires are formed above the gate regions and the source/drain regions of the memory cells as well.

First, a BPSG (Boro-Phospho Silicate Glass) film 58 serving as an interlayer insulating film is accumulated (FIG. 8B) to a film thickness of 1000 nm for example on the element which is formed as shown in FIG. 8A (the same as (C-C) of FIG. 7). Then, a contact hole 58a, at which the surface of a portion of the polysilicon 55 serving as a word line is exposed, is opened by using photolithography and anisotropic etching (FIG. 8C). RIE (Reactive Ion Etching) is used as this anisotropic etching, and, at this time, over-etching is carried out so that poor opening does not arise.

Next, as shown in FIG. 9, a conductor such as tungsten (W) or the like is filled in the contact hole 58a by sputtering or CVD. Then, by photolithography and anisotropic etching, aluminum serving as the metal wires is patterned on the BPSG film 58, and a metal wire 30_2 serving as a word line is thereby formed.

(Structure of Contact Portion of Word Line and Metal Wire)

The structure of the contact portion of the word line and the metal wire, among the structures of the EEPROM which is formed by the above-described fabricating method, will be described hereinafter with reference to FIG. 9 and FIG. 10.

By the above-described fabricating method, the polysilicon 53 is formed at the region beneath the polysilicon 55 which serves as the word line 10_2, at the contact portion of the word line 10_2 and the metal wire 30_2 in the EEPROM relating to the present exemplary embodiment as shown in FIG. 9. This two-layer structure of polysilicon is applied not only to the connected portion of the word line 10_2 and the metal wire 30_2, but also to, among the plural word lines, the word lines at which the surface area of the patterned shape of the polysilicon 55 at the contact portion is relatively small (the word lines 10_2, 10_4 in the present exemplary embodiment).

Figure 10:
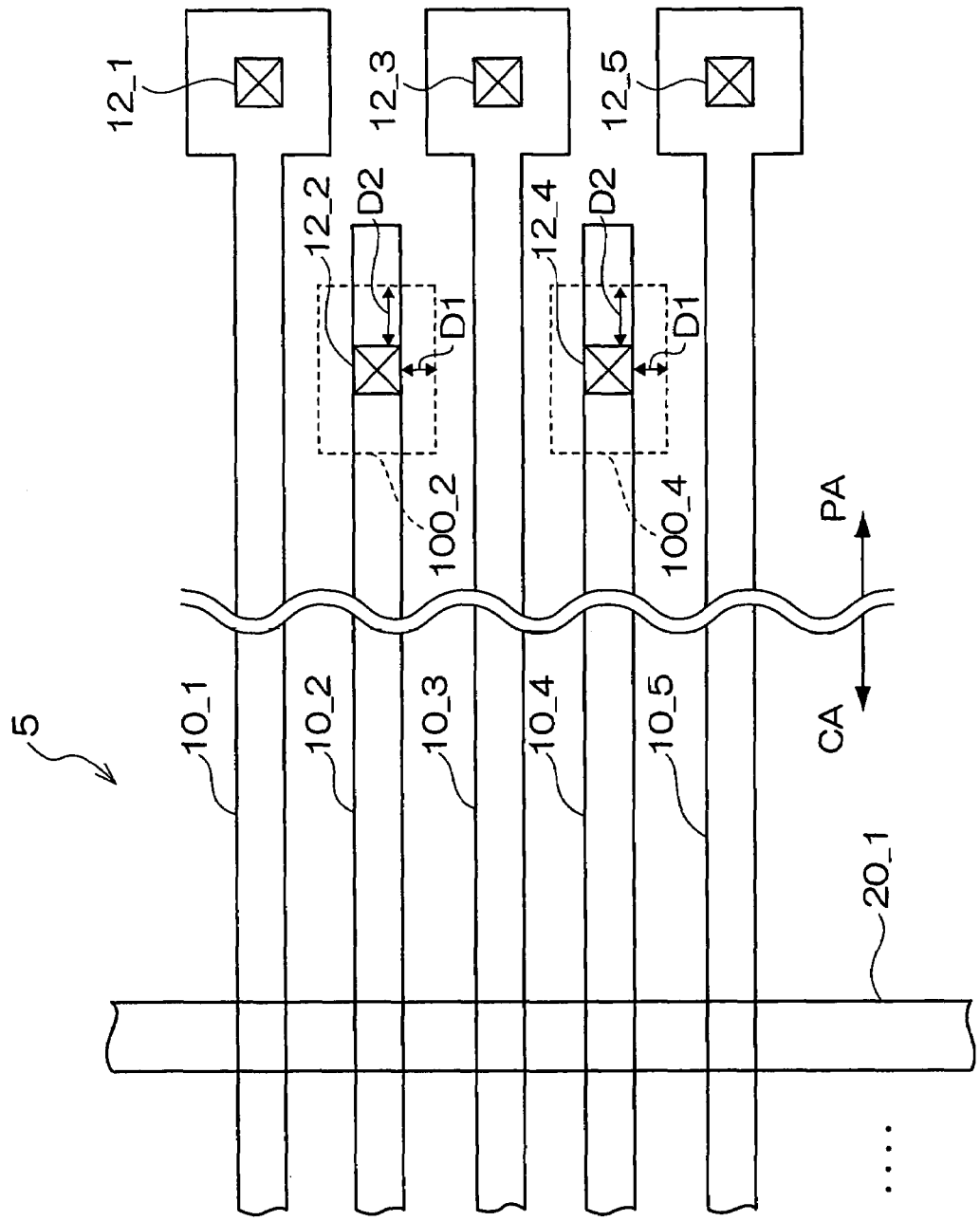
FIG. 10 is a plan view showing the patterned shape of a polysilicon at the lower portion of a polysilicon two-layer structure in the EEPROM relating to the exemplary embodiment.

FIG. 10 is a drawing showing the patterned shape (first shape) of the lower polysilicon 53 (first polysilicon film), at the polysilicon two-layer structure at the contact portion of the word line 10_2 and the metal wire 30_2 (see FIG. 1), and at the contact portion of the word line 10_4 and a metal wire 30_4. In FIG. 10, these patterned shapes are denoted as regions 100_2, 100_4.

As shown in FIG. 10, at the contact portion of the word line 10_2 and the metal wire (30_2, see FIG. 1), the end portions of the region 100_2 of the lower polysilicon 53 are formed so as to be separated from contact 12_2 by distance D1 at both sides in the bit line direction, and so as to be separated from the contact 12_2 by distance D2 at both sides in the word line direction. Similarly, at the contact portion of the word line 10_4 and the metal wire (30_4, see FIG. 1), the end portions of the region 100_4 of the lower polysilicon 53 are formed so as to be separated from contact 12_4 by distance D1 at both sides in the bit line direction, and so as to be separated from the contact 12_4 by distance D2 at both sides in the word line direction.

Note that the patterning of the polysilicon 53 shown in FIG. 10 is carried out simultaneously with the patterning of the floating gates of the memory cells as shown in FIG. 4, and therefore, no additional process arises.

Figure 11:
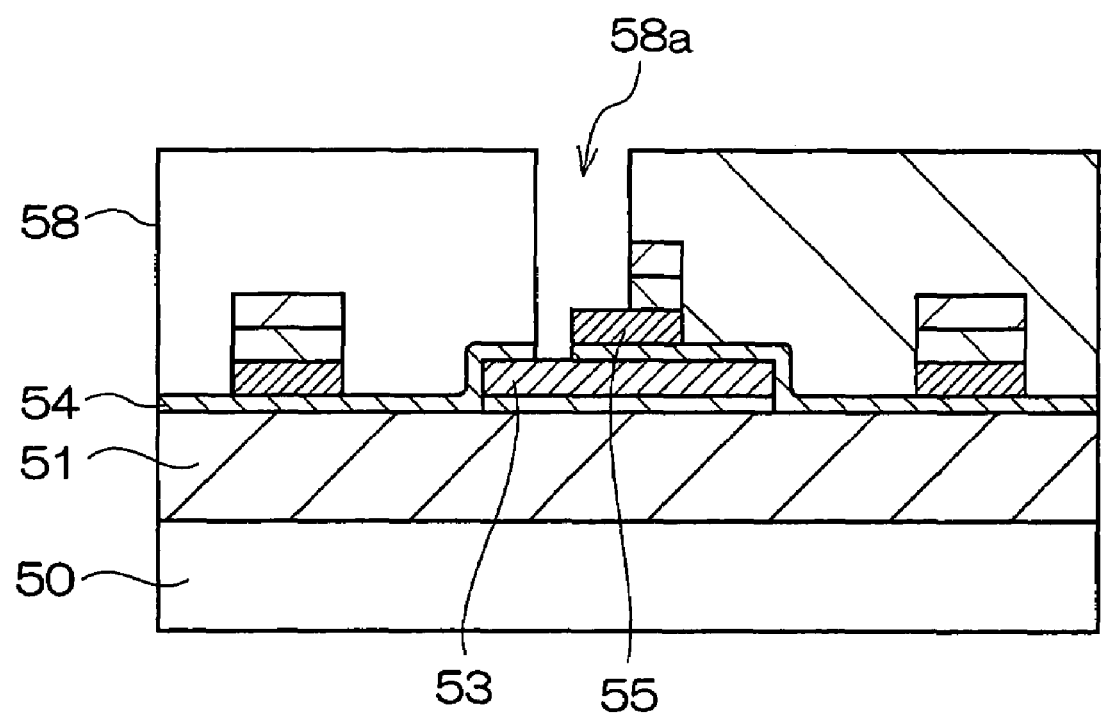
FIG. 11 is a drawing for explaining effects of the EEPROM relating to the exemplary embodiment.

The effects of this structure of the contact portion will be described next. FIG. 11 is a drawing for explaining the effects of the structure of the contact portion, and shows a case in which the etching at the time of forming the contact is not carried out accurately above the polysilicon 55.

Generally, in an EEPROM, in a case in which the interval between adjacent word lines (polysilicon) is narrow, it may be difficult to open the contact hole 58a with precision above the polysilicon 55. In the EEPROM relating to the present exemplary embodiment, in a case in which the contact hole 58a cannot be opened accurately above the polysilicon 55 and the position of opening thereof is offset to the front or back or to the left or right from the originally intended position, as shown in FIG. 11, the etching of the contact hole 58a reaches the polysilicon 53 and stops. Namely, among the polysilicon two-layer structure of the contact portion of the word line and the metal wire, the selection ratio of the lower polysilicon 53 to the oxide film is about 50 times which is high, and therefore, the lower polysilicon 53 functions as an etching stop layer. Accordingly, in the EEPROM relating to the present exemplary embodiment, even in a case in which the contacts cannot be precisely opened above the word lines, the electric signals from the peripheral circuits are transferred reliably to the control gates via the word lines.

Note that, generally, it is often the case that the minimum value of the interval between the word lines (10_1 through 10_3) formed of the polysilicon 55 is stipulated in the design rules from the standpoint of the accuracy of patterning. Accordingly, the EEPROM relating to the exemplary embodiment is particularly effective in cases in which the intervals between the adjacent word lines are narrow and the widths of the word lines (the polysilicon 55) cannot be made any greater.

Further, as shown in FIG. 10, at the contact portion, the polysilicon 53 which serves as the etching stop layer is formed into a region at which the distance D1 is ensured in the bit line direction and the distance D2 is ensured in the word line direction, with the contact being the substantial center. It is preferable that these distances D1, D2 be determined in accordance with the accuracy of the resist pattern of the photolithography in the contact forming process. Namely, if the distances D1, D2 are set to sizes of an extent that permit accuracy of the resist pattern at the time of contact formation, the lower polysilicon 53 always functions as an etching stop layer.

As described above, in accordance with the EEPROM of the present exemplary embodiment, the polysilicon 53 (first polysilicon layer) of a fixed region which is substantially centered around the contact hole is provided at the contact portion of the word line and the metal wire. Therefore, even in cases in which the contact cannot be opened accurately above the word line, the polysilicon 53 functions as an etching stop layer, and the substrate is not over-etched. Accordingly, even in cases in which the intervals between adjacent word lines are narrow, in the EEPROM relating to the exemplary embodiment, problems caused by poor junctions do not arise.

Note that, among the polysilicon two-layer structure of the contact portion of the word line and the metal wire which is described in the present exemplary embodiment, the material at the lower portion which functions as the etching stop layer is not limited to polysilicon, and another material can be used. It suffices for this material to have a selection ratio which is high with respect to the oxide film, and for this material to function as an etching stop layer.

Further, the above-described polysilicon can be used as the material of the floating gate of the memory cell, and a material other than polysilicon can be used as the etching stop layer of the contact portion of the word line and the metal wire. For example, a metal material such as tungsten silicide (WSix) or tungsten (W) or the like has a high etching selection ratio with respect to an oxide film, and therefore can be used as the etching stop layer. However, in a case in which the material of the floating gate electrode of the memory cell and the material of the etching stop layer of the contact portion of the word line and the metal wire are different, both cannot be patterned simultaneously, and therefore, the number of processes increases. Accordingly, from the standpoint of laborsaving in the fabricating processes, it is preferable that the etching stop layer be able to be patterned simultaneously by the same material as the floating gate of the memory cell.

SECOND EXEMPLARY EMBODIMENT

An EEPROM, which is another exemplary embodiment of the nonvolatile semiconductor memory of the present invention, will be described hereinafter.

Figure 12:
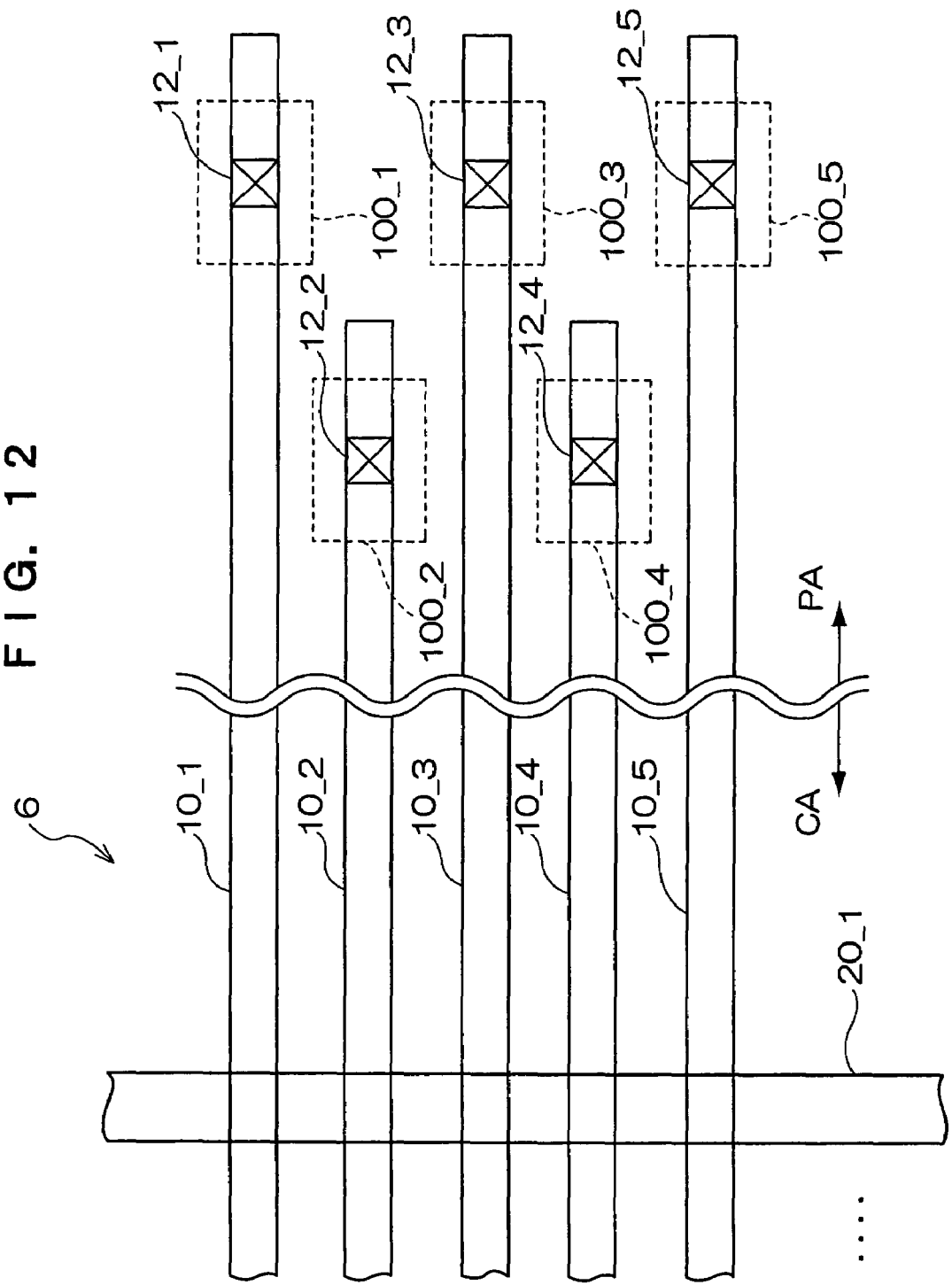
FIG. 12 is a plan view showing the patterned shape of a polysilicon at the lower portion of a polysilicon two-layer structure in an EEPROM relating to another exemplary embodiment.

FIG. 12 is a plan view showing a patterned shape of the lower polysilicon 53 (first polysilicon film) in the polysilicon two-layer structure in the EEPROM relating to the present exemplary embodiment. In FIG. 12, the patterned shape is shown as regions 100_1 through 100_5.

As shown in FIG. 12, in the EEPROM relating to the present exemplary embodiment, differently than in the first exemplary embodiment, the polysilicon 53 of a fixed region which is substantially centered around the contact is formed at the contact portions of all of word lines (10_1 through 10_5) and the metal wires, and not just at the contact portions of some of the word lines. Namely, the two-layer structure of polysilicon, in which the polysilicon 53 is the first layer and the polysilicon 55 is the second layer, is formed beneath the contacts 12_1 through 12_5. The first polysilicon 53, which is the first layer, is patterned into the regions 100_1 through 100_5 at which the respective contacts are the substantial centers thereof.

In the same way as in the first exemplary embodiment, the polysilicon 53 which is patterned into the regions 100_1 through 100_5 functions as an etching stop layer.

Note that, in the same way as in the first exemplary embodiment, the polysilicon 53 which is patterned into the regions 100_1 through 100_5 is preferably formed simultaneously with the patterning of the floating gate of the memory cell. Further, although the regions 100_1 through 100_5 may be formed of a material other than the polysilicon 53, in this case, it is preferable that they be the same material as the floating gate of the memory cell.

In the EEPROM relating to the present exemplary embodiment, the polysilicon 53, which is for permitting positional offset of the contacts, is patterned at all of the contact portions of the word lines and the metal wires. Therefore, the degrees of freedom in patterning the word lines (the polysilicon 55) are improved as compared with the first exemplary embodiment. Accordingly, as shown in FIG. 12, all of the word lines (10_1 through 10_5) can be formed rectilinearly.

Exemplary embodiments of the present invention have been described above in detail, but the specific structures are not limited to these exemplary embodiments, and changes in design, other modifications, and the like within a scope which does not depart from the gist of the present invention also are included.

Figure 13:
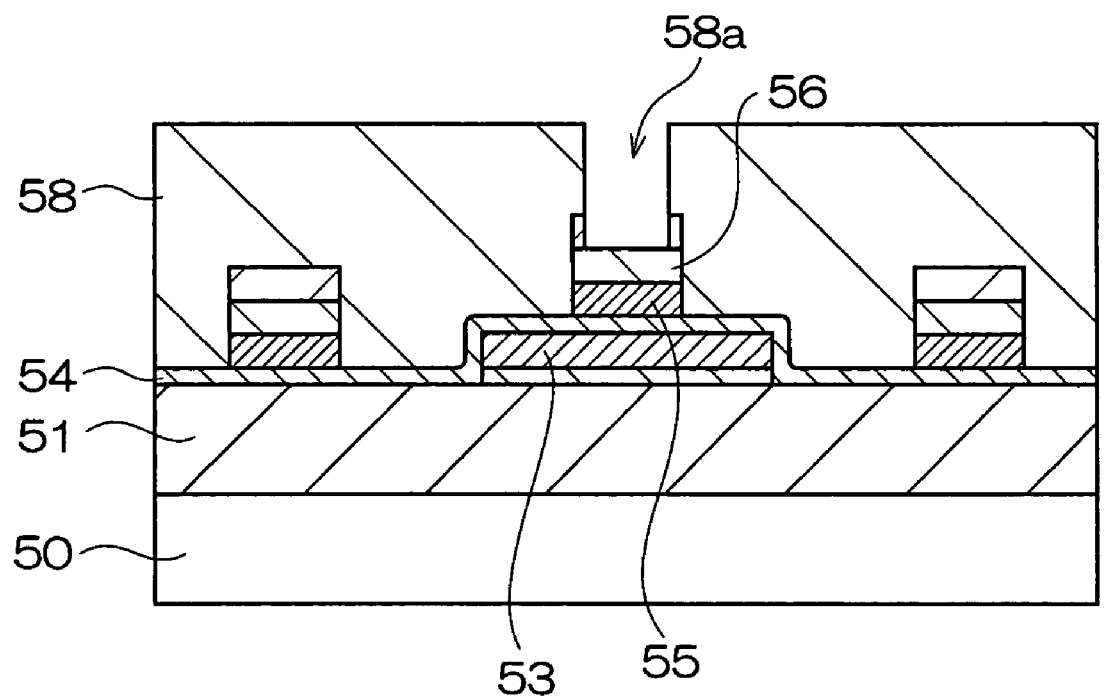
FIG. 13 is a cross-sectional view showing the method of fabricating the EEPROM relating to another exemplary embodiment.
Figure 14:
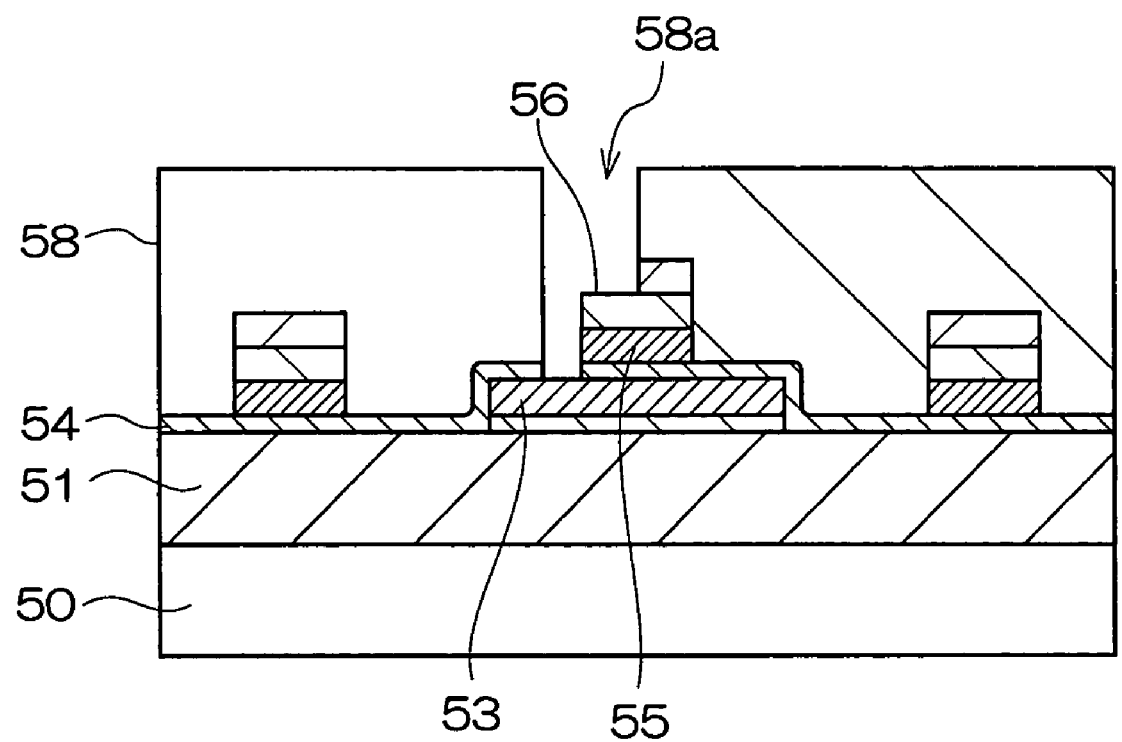
FIG. 14 is a drawing for explaining effects of the EEPROM relating to another exemplary embodiment.

For example, in the above-described exemplary embodiments, a contact hole 58a, at which the surface of a portion of the polysilicon 55 serving as a word line is exposed, is opened by using photolithography and anisotropic etching. However, as shown in FIG. 13, a contact hole 58a may be opened at the surface of a portion of the a tungsten silicide film 56. Also in this modification, even when the etching at the time of forming the contact is not carried out accurately above the a tungsten silicide film 56 as shown in FIG. 14, the electric signals from the peripheral circuits are transferred reliably to the control gates via the word lines.

Furthermore, for example, in the above-described exemplary embodiments, a thermal oxidation film is used as the tunnel oxide film. However, the formation conditions thereof may be other than those described above, or an insulating film such as a nitrided oxide film may be used. Moreover, in the above-described exemplary embodiments, the insulating film above the floating gate is formed by a single-layer oxide film, but may be formed by an ONO film, and with respect to the formation conditions thereof as well, CVD may be used rather than thermal oxidation. In addition, aluminum is used at the metal wire layer in the above-described exemplary embodiments, but a silicide such as WSi, or a layered film of polysilicon and silicide, may be used.

What is claimed is:

1. A nonvolatile semiconductor memory, comprising:
a plurality of metal wires for connecting to a peripheral circuit of the nonvolatile semiconductor memory;
a semiconductor substrate;
a first insulating film formed on the semiconductor substrate;
an etching stop layer formed on the first insulating film;
a second insulating film formed on the etching stop layer; and
a conductive film formed on the second insulating film, the conductive film forming a plurality of word lines, wherein
the metal wires are connected to the word lines through a plurality of contact portions of the word lines, and
the etching stop layer covers and surrounds the plurality of contact portions of the word lines in a plan view.

2. The nonvolatile semiconductor memory of claim 1, wherein the etching stop layer is formed of a same material as floating gates of the memory cells.

3. The nonvolatile semiconductor memory of claim 2, wherein the etching stop layer is a first polysilicon film.

4. The nonvolatile semiconductor memory of claim 3, wherein the etching stop layer is of a shape of a rectangle, and respective sides of the rectangle are formed so as to be separated by predetermined distances from the contact portion as seen in the plan view.

5. The nonvolatile semiconductor memory of claim 2 wherein the etching stop layer is of a shape of a rectangle, and respective sides of the rectangle are formed so as to be separated by predetermined distances from the contact portion as seen in the plan view.

6. The nonvolatile semiconductor memory of claim 1, wherein the etching stop layer is of a shape of a rectangle, and respective sides of the rectangle are formed so as to be separated by predetermined distances from the contact portion as seen in the plan view.

* * * * *